United States Patent [19]

Temple

[11] Patent Number: 4,885,630

[45] Date of Patent: Dec. 5, 1989

[54] HIGH POWER MULTI-LAYER SEMICONDUCTIVE SWITCHING DEVICE HAVING MULTIPLE PARALLEL CONTACTS WITH IMPROVED FORWARD VOLTAGE DROP

[75] Inventor: Victor A. K. Temple, Clifton Park, N.Y.

[73] Assignee: Electric Power Research Institute, Palo Alto, Calif.

[21] Appl. No.: 212,090

[22] Filed: Jun. 24, 1988

Related U.S. Application Data

[63] Continuation of Ser. No. 923,674, Oct. 27, 1986, abandoned.

[51] Int. Cl.[4] .................... H01L 23/54; H01L 25/08; H01L 25/14
[52] U.S. Cl. ........................................ 357/71; 357/67; 357/79; 357/38
[58] Field of Search .................. 357/71, 67, 38, 79, 357/81

[56] References Cited

U.S. PATENT DOCUMENTS

| | | | |
|---|---|---|---|
| 4,127,863 | 11/1978 | Kurata | 357/38 |
| 4,176,443 | 12/1979 | Iannuzzi et al. | 357/71 |
| 4,246,596 | 1/1981 | Iwasaki | 357/56 |
| 4,618,877 | 10/1986 | Araki et al. | 357/79 |
| 4,638,553 | 1/1987 | Nilarp | 357/38 |
| 4,724,475 | 2/1988 | Matsuda | 357/79 |

Primary Examiner—Rolf Hille
Assistant Examiner—S. V. Clark
Attorney, Agent, or Firm—Flehr, Hohbach, Test, Albritton & Herbert

[57] ABSTRACT

A large area solid state multi-layer semiconductive switching device having multiple parallel contacts accommodates large magnitudes of currents and provides a uniform and a relatively low voltage drop for each of its multiple parallel contacts. This is provided by a cathode pole piece which is of a semiconductive material such as silicon which matches the silicon semiconductive material and thus the thermal expansion characteristics of the active part of the semiconductive switching device. In addition, a permanent bond is provided between the cathode pole piece and the multiple contacts by providing suitable metallic contact layers and then by the application of heat and pressure.

11 Claims, 2 Drawing Sheets

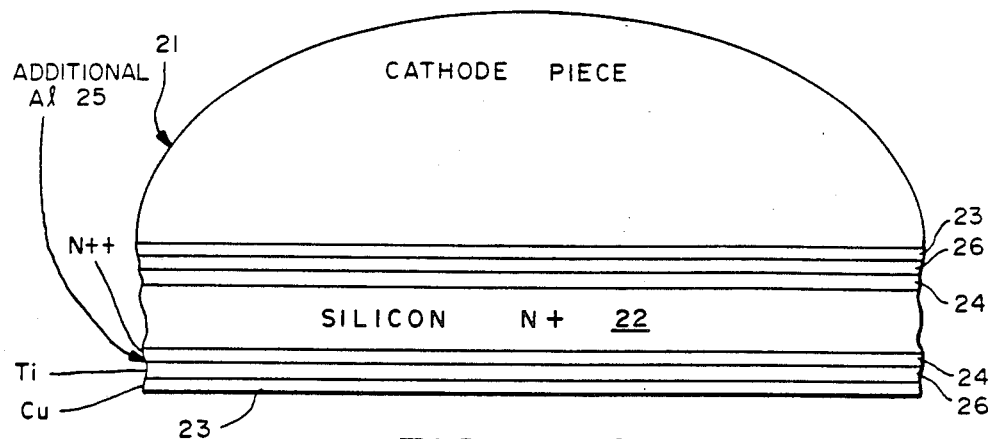
FIG.—1A
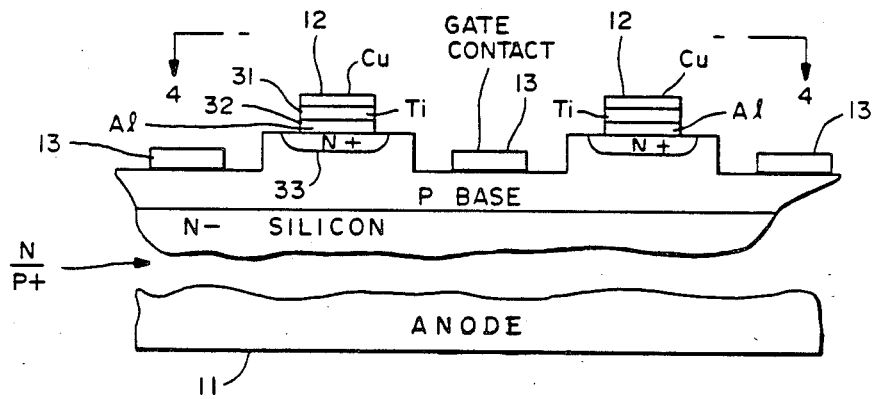
FIG.—1B
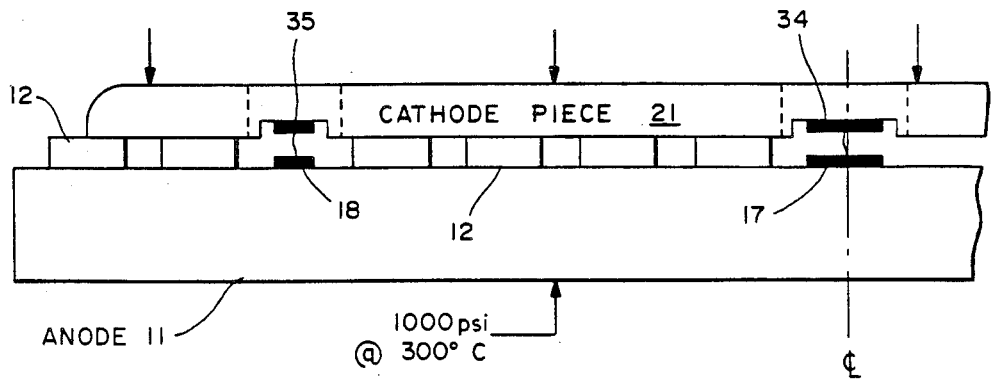
FIG.—2

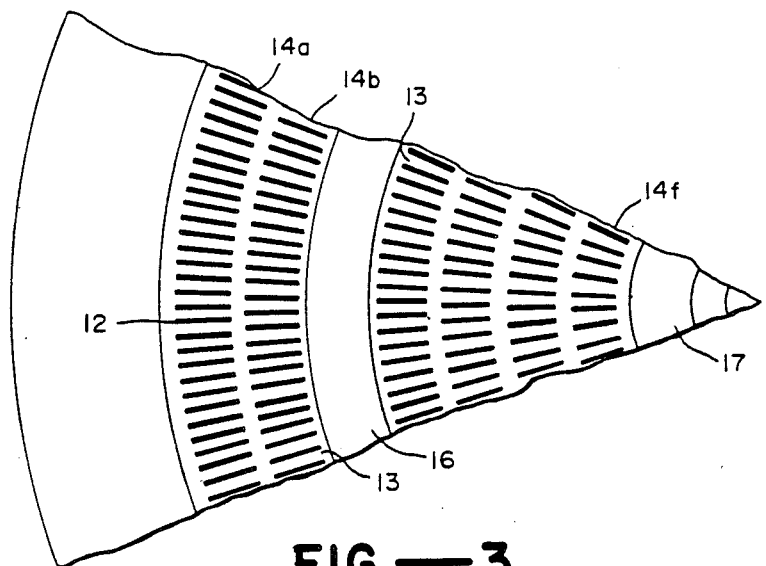
FIG.—3
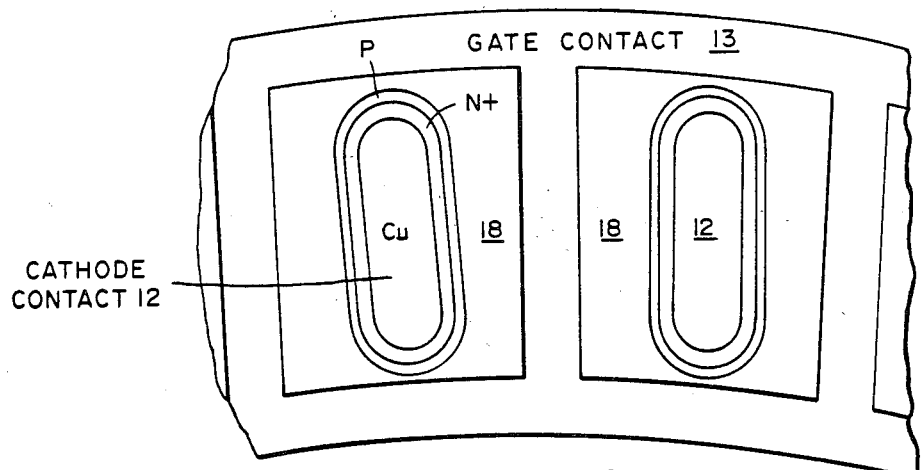
FIG.—4
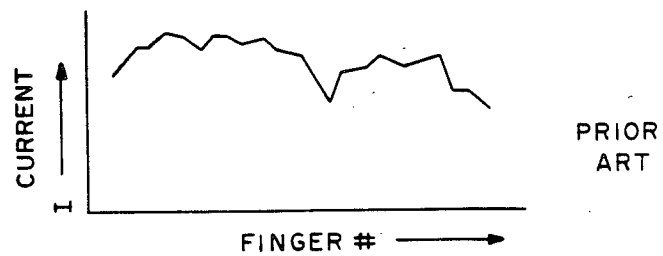
FIG.—5

HIGH POWER MULTI-LAYER SEMICONDUCTIVE SWITCHING DEVICE HAVING MULTIPLE PARALLEL CONTACTS WITH IMPROVED FORWARD VOLTAGE DROP

This is a continuation of application Ser. No. 23,674 filed Oct. 27, 1986 now abandoned.

The present invention is directed to a high power multi-layer semiconductive switching device having multiple parallel contacts with improved forward voltage drop and more specifically to a semiconductive switching device such as a gate turn-off thyristor.

High power semiconductive switching devices because of the inherent requirement of carrying high currents, must have a relatively large area. In other words, there are hundreds of individual, for example, gate turn off thyristor devices, which are integrated on a single wafer in a parallel relationship.

Because of the large area and the problem of stress under thermal cycling, the making of electrical contact with a single, for example, cathode pole piece with the multiple contacts is a difficult problem. For example, the various contacts or, as more commonly known in the art as fingers, may have both an excessive forward voltage drop because of the dry type of contact necessary and have differing voltage drops or resistances. If the various fingers do not share current equally, turn off will not occur at the same time and thus unequal currents will be carried. Thus the overall capacity of the device is limited.

FIG. 5 illustrates the characteristic of a typical prior art device where the current carried by various multiple contact fingers of a GTO thyristor type device significantly varies from finger to finger. This difference is increased by the addition of a widely variable voltage drop across widely variable dry contact resistances.

OBJECTS AND SUMMARY OF THE INVENTION

It is an object of the present invention to provide an improved semiconductive switching device having multiple parallel contacts and more specifically a device where the contact voltage drop for the contacts is substantially reduced and substantially the same for each contact.

In accordance with the above object, there is provided a high power multi-layer semiconductive switching device having multiple parallel contacts for accommodating large magnitudes of currents. The device comprises a large area unitary contact means substantially consisting of a material matching the thermal expansion characteristic of the semiconductive material of the switching device. The large area unitary contact is in electrical contact with the parallel contacts and carries at least one electrical contact layer for making a permanent bond with the parallel contacts. This provides a voltage drop of the parallel contacts which is reduced and made substantially similar for each of the contacts.

BRIEF DESCRIPTION OF THE DRAWINGS

FIG. 1A is a perspective view in fragmentary form of a cathode contact embodying the present invention.

FIG. 1B is a cross-sectional view of an anode portion of a semiconductor switching device embodying the present invention.

FIG. 2 is a simplified assembly view of FIGS. 1A and 1B also illustrating the process for construction of the invention.

FIG. 3 is a plan view of FIG. 1A showing a much greater area.

FIG. 4 is a plan view of FIG. 1A substantially taken along the lines 4—4 of FIG. 1A.

FIG. 5 is a characteristic curve illustrating the prior art.

DESCRIPTION OF PREFERRED EMBODIMENT

FIG. 1B illustrates in simplified form, a gate turn off (GTO) thyristor device which has multiple parallel contacts for accommodating large magnitudes of current. Basically, there is an anode 11, the multiple contacts 12, and gate contacts 13 which are on a P-type base. In general, below each cathode contact 12 is a sequence of doped silicon conductive layers; viz N+, P, N−, N, and P+. FIG. 3 is a top view of FIG. 1B but including a much greater area which shows several circular areas (specifically 14a through 14f) of the multiple parallel contacts 12 along with the intermediate gate contacts 13 which are connected together by gate contact bands 16 and 17.

FIG. 4 shows the foregoing in better detail where each cathode contact 12 is shown as greatly enlarged on top of an N+ mesa surrounded by a P-type mesa, with a valley area being formed as shown at 18 on the P-type base on which the gate contact 13 of deposited metal is placed. All of the gate contacts 13 are then brought out at bands 16 and 17 illustrated in FIG. 3.

Since, as illustrated in FIG. 3, the entire device is of a relatively large area, thermal loading problems are extensive. Thus, in order to provide a single large unitary contact to the various fingers 12 and to avoid the variation of voltage drop as illustrated in FIG. 5 which was created by a prior flat disk of metal which was merely held on the contacts 12 by pressure, there is provided the large area unitary contact 21 of FIG. 1A which forms the cathode pole piece of the GTO thyristor structure. This cathode includes as its central core portion 22, semiconductive material of doped silicon, for example N+ with arsenic, which is a material of similar thermal expansion as the silicon material of the active thyristor portion of FIG. 1B. Thus any thermal expansion or loading is identically matched between the two portions of FIGS. 1A and 1B. This allows the cathode portion 21, along with its metallized exterior layers, and specifically its outer layer of copper 23, to be permanently bonded, for example by thermal compression, to the fingers 12 of FIG. 1B. Moreover, by heavily doping with a concentration typically of $5 \times 10^{18}$, conductivity is enhanced to improve forward drop characteristics.

Specifically, the silicon core 22 has diffused in it a highly doped N++ surface layer 24 to prevent a Schottky barrier from forming and to provide improved ohmic contact. This surface layer is of a concentration typically of $10^{20}$ which, of course, is two orders of magnitude higher than N+ core 22. Then an intermediate titanium (Ti) layer 26 is provided between the copper layer 23 and the semiconductive material to prevent migration of the copper to the semiconductive material which might poison it or reduce its lifetime. This Ti layer also (in addition to acting as a barrier) serves to increase adhesion as copper to titanium to silicon has better adhesion than copper to silicon. Titanium also has good adhesion to aluminum. Gold or silver can be substituted for copper as could any material that forms a thermal compression bond at moderate temperatures. Likewise the titanium barrier/adhesion layer could be replaced by chromium, for example. The silicon contact 21 might also include a fairly thick (relative to the barrier/adhesion and thermal compression bond metals) metal layer which is more compliant than silicon so as to more uniformly distribute pressure if the mating surfaces are not perfectly flat; e.g. 5 microns of aluminum. This is illustrated in FIG. 1A at 25 between the N++ diffusion 24 and Ti layer 26.

The other side of the silicon core 22, has similar layers 23, 24 and 26. The core layer of N+ silicon 22 is arsenic doped to provide a conductivity of approximately 0.0015 ohm-centimeters. The contact layer 23 is preferably of copper but may be of any other suitable highly conductive metal such as gold or silver. The object is to have it bond to the parallel contacts 12 of FIG. 1B at a relatively low temperature and pressure, for example 1,000 psi at 300° C.

Referring to FIG. 1B, under the copper contact finger 12 lies a titanium or chromium adhesion/barrier interface layer 31 which again, as in the case of cathode contact 21, prevents diffusion of the copper into the semiconductive material. This is placed on an aluminium layer 32 which is deposited directly on the N+ island 33. Aluminium is chosen since it interfaces well with the silicon and with the titanium layer 31. Also it provides compression compliance, as discussed above with reference to cathode contact 21 for distributing stress. With respect to the titanium layer, another material such as chromium or chromium silicide could be utilized. Also, the aluminium contact layer to the silicon device could be a refractory metal or a refractory metal silicide in which case the barrier/adhesion layer would be optional.

To permanently bond the cathode 21 and its copper contact layer 23 to the multiple parallel contact 12 of FIG. 1B, pressure and heat are applied to the opposing sides of the cathode and anode as illustrated in FIG. 2. Such pressure might typically be 1,000 psi at a temperature of 300° C. However, this is not critical. With respect to temperature, it should be lower than 400° C. since this is the temperature at which aluminium will start to dissolve some amount of silicon. And then the pressure is limited, of course, by the structural characteristics of the material itself. The various contacts 12 are only schematically illustrated but generally they would be of the format of FIG. 3. A key feature of the bonding is that no liquid be formed that would move laterally along the device surface and result in shorted gates, for example. However, if the gate contacts are passivated, the effects of liquid may be minimized.

Gate channels 34 and 35 are placed in cathode piece 21 to allow conductive leads to the gates 15 and 17 to be lead out. Alternatively, cathode piece 21 may be divided as shown by the dashed lines around channels 34 and 35 into a central disk (with a hole in the center) and an outer ring to allow direct electrical connection to the gate contact points. In multi-contact devices where the gates may be at the same level as the cathode finger contacts, (e.g., a power transistor) cathode piece 21 can have its mating surface pre-etched to avoid contact with or bonding to gates.

With the application of the above pressure and heat to form a permanent bond, this provides a current characteristic with reference to FIG. 5 which is essentially flat. In other words, there is no variation from contact to contact. Thus, operation of the device is significantly improved since there is no one or small group of contacts which are carrying an excessive amount of current, for example, at turn off.

Typical dimensions of the metal layers, referring to FIG. 1B, is an aluminium layer 32 of five microns, a titanium layer 31 of 1500 angstroms and a copper layer 31 of one micron.

From a semiconductive processing point of view, the various metallic layers are formed by typical evaporation or sputtering techniques. The present invention is applicable in addition to gate turn-off thyristor as illustrated in the preferred embodiment, to other high current devices of relatively large area where a number of multiple parallel contacts are present. In general, this is a significant improvement over previous contact methods which, because of the inherent mismatch between, for example, the silicon wafer and a metal cathode pole piece, a dry type of contact was required to allow relative lateral movement or "scrubbing" to take place between the contact fingers and the unitary pole piece. In the present invention scrubbing does not take place at the contact fingers, at least, and thus, not only is there achieved a much more uniform and lower forward voltage drop at those critical contact points but also, a much more reliable, rugged device due to the elimination of the mechanical scrubbing action.

Thus an improved high power multi-layer semiconductor switching device has been provided.

What is claimed:

1. A high power multi-layer semiconductive switching device having multiple parallel contacts for accommodating large magnitudes of current comprising:
   a large area unitary contact means substantially consisting of a material matching the thermal expansion characteristics of said semiconductive material of said switching device said unitary contact means being in electrical contact with said parallel contacts, said large area unitary contact means carrying at least one electrical contact layer making a thermal compression bond with said parallel contacts of said device so no relative movement between contacts is allowed, both said parallel contacts and said large area unitary contact means carrying at least one electrical contact layer capable of forming a said thermal compression bond at moderate temperatures, whereby the voltage drop across the parallel contacts is reduced and made substantially similar for each of said contacts.

2. A switching device as in claim 1 where said switching device is a gate turn-off thyristor.

3. A switching device as in claim 1 where said unitary contact means is in the shape of a flat disc having its outer surface coated to form said contact layer.

4. A switching device as in claim 3 where said contact layer is copper and including a layer of titanium underlying said copper to prevent migration of said copper to said material of said contact means.

5. A switching device as in claim 3 where said parallel contacts of said switching device include an outer layer of copper for bonding to said contact layer of said unitary contact means.

6. A switching device as in claim 3 where said unitary contact means is formed of a semiconductive material having a highly doped surface diffusion layer for carrying said contact layer.

7. A switching device as in claim 1 where said parallel contacts of said switching device include a first compression compliant layer consisting of a metal which is relatively soft for said compression compliance and makes good ohmic contact with said semiconductive material of said switching device, a third or outer layer of metal which bonds well to said contact layer of said unitary contact means and a second or intermediate layer which adheres well to said first and third layers and also prevents migration of metal to said semiconductive material.

8. A switching device as in claim 7 where said first layer is aluminum, said second layer is one of the group consisting of titanium and chromium, and said third layer is one of the group consisting of copper, gold and silver.

9. A switching device as in claim 3 where said unitary contact means includes a layer of compression compliant aluminum.

10. A switching device as in claim 1 where said unitary contact means consists of a core of semiconductive material having a doping concentration of at least $10^{18}$ atoms/cubic centimeter.

11. A device as in claim 10 where said semiconductive material includes a highly doped surface diffusion layer having a concentration at least two orders of magnitude greater than $10^{18}$ atoms/centimeter.

* * * * *